(12) United States Patent
Kim et al.

(10) Patent No.: US 10,559,681 B2
(45) Date of Patent: Feb. 11, 2020

(54) HIGH VOLTAGE LATERAL JUNCTION DIODE DEVICE

(71) Applicant: Texas Instruments Incorporated, Dallas, TX (US)

(72) Inventors: Sunglyong Kim, Allen, TX (US); Seetharaman Sridhar, Richardson, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/850,854

(22) Filed: Dec. 21, 2017

(65) Prior Publication Data
US 2019/0198666 A1    Jun. 27, 2019

(51) Int. Cl.
| | |
|---|---|
| H01L 29/78 | (2006.01) |
| H01L 21/28 | (2006.01) |
| H03K 17/687 | (2006.01) |
| H01L 29/10 | (2006.01) |
| H01L 21/761 | (2006.01) |
| H01L 29/49 | (2006.01) |
| H01L 29/66 | (2006.01) |
| H01L 29/06 | (2006.01) |

(52) U.S. Cl.
CPC .... *H01L 29/7819* (2013.01); *H01L 21/28035* (2013.01); *H01L 21/761* (2013.01); *H01L 29/0646* (2013.01); *H01L 29/1095* (2013.01); *H01L 29/4916* (2013.01); *H01L 29/66136* (2013.01); *H01L 29/66681* (2013.01); *H03K 17/687* (2013.01)

(58) Field of Classification Search
None
See application file for complete search history.

(56) References Cited

U.S. PATENT DOCUMENTS

| | | | |
|---|---|---|---|
| 7,045,830 | B1 | 5/2006 | Cai et al. |
| 7,605,428 | B2 | 10/2009 | Williams et al. |
| 7,608,907 | B2 | 10/2009 | Mallikarjunaswamy |
| 9,245,998 | B2 | 1/2016 | Zhang et al. |
| 2009/0173966 | A1 | 7/2009 | Cai |
| 2017/0243937 | A1 | 8/2017 | Ward et al. |

FOREIGN PATENT DOCUMENTS

| | | |
|---|---|---|
| EP | 2325889 A2 | 5/2011 |
| JP | 57-198414 | 12/1982 |

OTHER PUBLICATIONS

PCT Search Report for Application No. PCT/US2018/066933, dated Apr. 4, 2019.

*Primary Examiner* — Long Pham
(74) *Attorney, Agent, or Firm* — Andrew R. Ralston; Charles A. Brill; Frank D. Cimino

(57) ABSTRACT

A lateral junction diode device includes a substrate having at least a semiconductor surface layer. A depletion-mode LDMOS device is in the semiconductor surface layer including a source, drain, and a gate above a gate dielectric, and a channel region under the gate on the gate dielectric. A drift region is between the channel region and the drain, wherein the drain also provides a cathode for the lateral junction diode device. An embedded diode includes a second cathode and an anode that is shared with the device. The embedded diode is junction isolated by an isolation region located between the anode and the source. The anode and isolation region are directly connected to the gate and the second cathode is directly connected to the source.

13 Claims, 22 Drawing Sheets

HIGH VOLTAGE LATERAL JUNCTION DIODE DEVICE

FIELD

Disclosed aspects relate to semiconductor devices, more specifically to integrated circuits including high voltage diode devices.

BACKGROUND

Power semiconductors (e.g., power metal oxide semiconductor field effect transistors (MOSFETs)) are widely used in a variety of applications. A gate driver is one application for power semiconductors that is used to drive high side power switches such as insulated-gate bipolar transistors (IGBTs) or power MOSFETs for electronic ballasts, switched mode power supplies, or DC or AC motor drives. A gate driver basically includes a level-shifter in combination with a ground (GND) referred low voltage controller and a high voltage referred driver.

Gate drivers may include a laterally diffused MOSFET (LDMOS) device for its high voltage tolerance. As known in the art of high voltage circuits, an LDMOS device is an asymmetric power MOSFET designed for low on-resistance and a high blocking voltage. These features for an n-channel enhancement mode LDMOS device are obtained by creating a diffused p-type channel region in a lightly doped n-type drain region. LDMOS devices may also be configured as depletion-mode devices.

In order to a deliver a GND referred voltage source or supply (e.g., VCC, or VDD) to the high voltage referred driver circuit, a bootstrap capacitor and a bootstrap diode are generally used. A bootstrap diode conducts current when forward biased to deliver power from VCC or VDD to a series connected bootstrap capacitor when the high side power switch is turned off. The bootstrap diode protects VCC or VDD from high voltage when the high side power switch is turned on.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include integrated circuits (ICs) including a lateral junction diode device that comprises a depletion-mode LDMOS device connected in series with an embedded diode. The LDMOS device includes a source, drain, a gate above a gate dielectric, and a channel region under the gate on the gate dielectric. A drift region is between the channel region and the drain, wherein the drain also provides a cathode for the lateral junction diode device. The embedded diode includes another cathode referred to herein as a 'second cathode' and an anode that is an anode also for the lateral junction diode device. The embedded diode is junction isolated by an isolation region that comprises a well coupled to a buried layer located between the anode and the source. The anode and isolation region are directly connected to the gate, and the second cathode is directly connected to the source.

BRIEF DESCRIPTION OF THE DRAWINGS

Reference will now be made to the accompanying drawings, which are not necessarily drawn to scale, wherein.

DETAILED DESCRIPTION

Figure 1A:
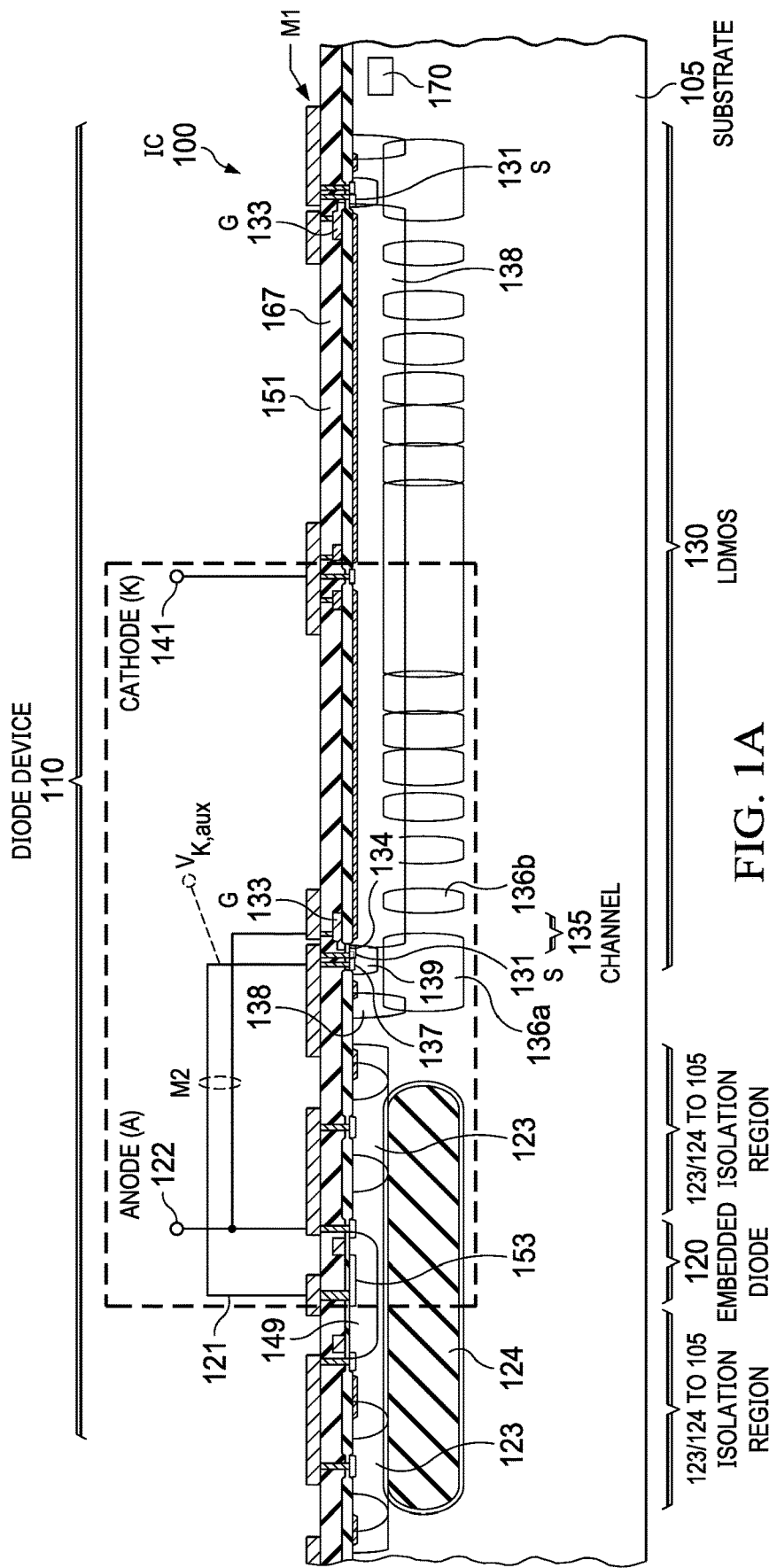
FIG. 1A is a cross sectional depiction of an IC including an example lateral junction diode device that comprises a depletion-mode LDMOS device shown as an n-channel LDMOS (NLDMOS) device connected in series with and a junction isolated embedded diode, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize a heavily doped layer for blocking body diode induced substrate leakage current for a PN diode is insufficient for a high voltage process generally defined as a process supporting >a 100V BV for high voltage applications, such as for a high side gate driver, due to the resulting low blocking voltage. Instead of using a conventional high voltage diode, disclosed lateral junction diode devices combine in series connection a high BV depletion-mode LDMOS device and a junction isolated embedded diode.

When the lateral junction diode device is used in a gate driver for driving a power stage (see the high side gate driver in FIG. 3 described below) including a high side power switch for blocking the high voltage present during the off-state of the power switch, the embedded diode is for reducing the substrate leakage current from the body diode of the LDMOS device during the on-state of the power switch. Disclosed lateral junction diode devices thus solve the problem of body diode-induced substrate leakage current for high voltage diodes, such as for a monolithic high side gate driver IC, without the conventional need for a synchronous FET and additional circuitry to control the voltage on the gate of the synchronous FET.

Figure 2A:
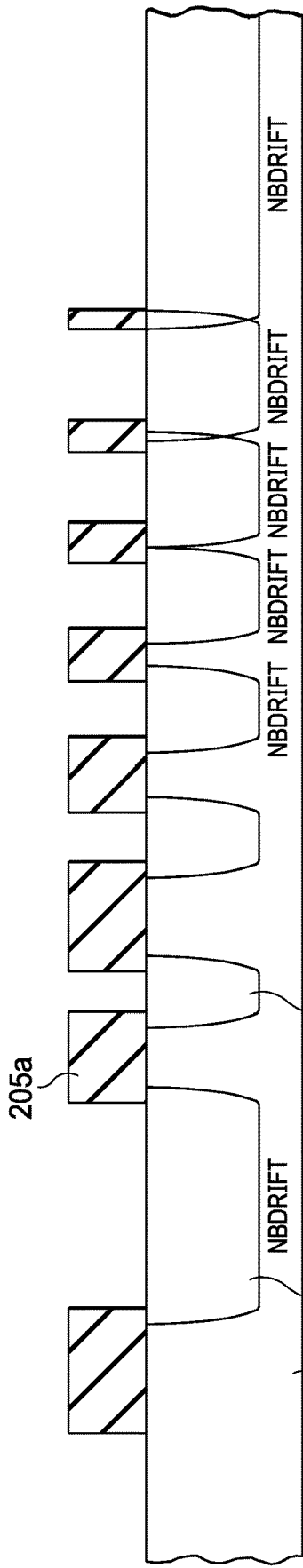
FIGS. 2A-2P are cross-sectional diagrams showing processing progression for an example method of forming an IC including a lateral junction diode device including a series connected depletion-mode NLDMOS device and a junction isolated embedded diode, according to an example aspect.

FIG. 1A is a cross sectional depiction of an IC 100 including an example lateral junction diode device 110 with its series connected embedded diode 120 and a depletion-mode NLDMOS device 130. The dashed lines in FIG. 1A define the spatial extent of half-device used in FIG. 2A-2P showing a processing progression described below. Although LDMOS devices are described herein as being an NLDMOS device 130, the LDMOS device for the lateral junction diode device 110 can also be a PLDMOS device as known in the art by changing all the doping types to the other doping type. The IC 100 is also shown including functional circuitry 170 comprising a plurality of transistors, resistor, and capacitors configured together shown by a circuitry block that realizes and carries out a desired functionality, such as that of a digital IC (e.g., digital signal processor) or analog IC (e.g., amplifier or power converter), and in one example a BiCMOS (MOS and Bipolar) IC. The capability of the functional circuitry 170 provided on a disclosed IC may vary, for example ranging from a simple device to a complex device. The specific functionality contained within functional circuitry 170 is not of importance to disclosed ICs.

The lateral junction diode device 110 can be seen to be a 2-terminal device, with a high voltage (HV) cathode 141 doped n-type shown as 'K' as the first terminal and an anode 122 doped p-type shown as 'A' as the second terminal which is the anode for both the lateral junction diode device 110 and for the embedded diode 120. The term 'HV cathode' as used herein is used to distinguish the lateral junction diode device's 110 cathode which provides a higher breakdown voltage with respect to its anode which is anode 122 as compared to the cathode 121 of the embedded diode 120 with respect to its anode which is also anode 122. The various terminal connections for lateral junction diode device 110 are shown provided by a metal 1 (M1) layer that contacts the p-type semiconductor surface layer of the substrate 105 by filled vias (e.g., W filled vias) formed through a dielectric layer 167 on the semiconductor surface layer. Further connections are provided by another metal layer, shown as M2, that connects some M1 features shown directly connecting the anode 122 and the nwell 123 diffused into the n-buried layer (NBL) 124 underneath (n-type isolation diffusion 123/124) providing one side of the junction isolation region with the other side being the p-type semiconductor surface layer of the substrate 105, to the gate 133, and the cathode 121 of the embedded diode 120 to the n+ source 131.

The embedded diode 120 as shown can have a circular (racetrack) geometry and the isolation diffusion 123/124 can form a ring around the embedded diode 120. As known in the art, by surrounding the lateral junction diode device 110 or other component on an IC with semiconductor material which is doped using an opposite type as compared to the substrate dopant type, and in operation connecting this surrounding material to a voltage which reverse-biases the p-n junction that forms, it is possible to create a region which forms an electrically isolated "well" around the component. The cathode 121 couples to a n+ contact 153 formed in a first pwell 149.

For the lateral junction diode device 110 comprising NLDMOS device 130 one substrate arrangement can be a p-epitaxial (epi) layer on a p-substrate. For example, the epi layer can have a doping concentration sufficiently low, such as $<1 \times 10^{16}$ cm$^{-3}$ or $<1 \times 10^{15}$ cm$^{-3}$, to provide the lateral junction diode device 110 a high BV.

NLDMOS device 130 as shown has a circular (racetrack) geometry and includes a n+ source 131, an n+ drain that shares the same node as the HV cathode 141, a gate electrode 133 (e.g., a polysilicon gate) above a gate dielectric 134, and a normally on channel region 135 under the gate electrode 133 over the gate dielectric 134. NLDMOS 130 can be configured as a multi-finger design as well. An n− drift region 138/136 is in the semiconductor surface layer between the channel region 135 and the drain that shares the same node as the HV cathode 141.

The n-buried (NB) layer drift (NBdrift) sub-regions 136a, 136b, . . . are shown in FIG. 1A spaced apart representing the as-implanted distribution used to form a diluted NBdrift region, having a lower dopant concentration on the source end as compared to the doping level at the drain end. The respective NBdrift sub-regions 136a, 136b, . . . after the heat cycling during fabrication will in the final IC all be connected together laterally and will also diffuse up near the semiconductor surface. The gate dielectric layer 134 can comprise silicon oxide, silicon oxynitride, or other dielectric material. In one particular aspect the gate dielectric layer 134 can comprise 200 Å of silicon oxide.

The source 131 is formed in a pwell referred to herein as a deep pwell (Dwell) 139 that provides a body region for the NLDMOS device 130, where the Dwell 139 includes a p+ contact 137. The p+ contact 137 to the Dwell 139 and the source 131 are shown directly connected together by vias coupled to metal 1.

The embedded diode 120 includes a cathode 121, and an anode 122 that as noted above functions as the anode for both the embedded diode 120 and for the lateral junction diode device 110. The embedded diode 120 as described above is junction isolated by an isolation region that includes an n-type diffusion 123/124 providing one side of the junction isolation region located between the anode 122 and the source 131 that is diffused into p-layer (e.g., a p-epi layer) on the surface of the substrate 105. The anode 122 and isolation region are directly connected to the gate electrode 133, such as using doped polysilicon or filled vias together with metal thereon (e.g., M1 and M2). The cathode 121 is directly connected to the source 131, such as by doped polysilicon or by metal.

Figure 1B:
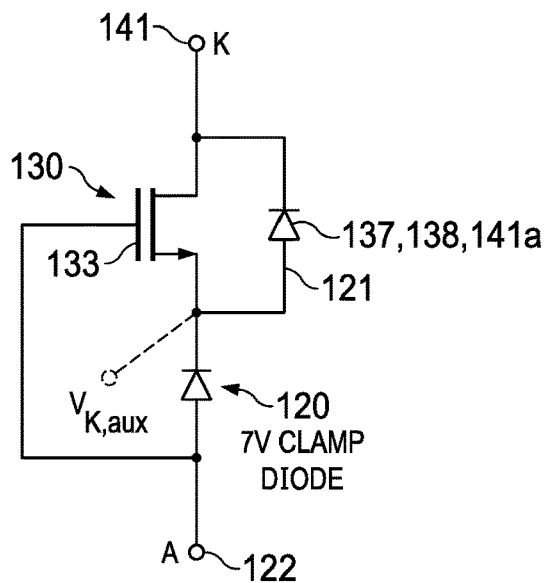
FIG. 1B shows an equivalent circuit for the lateral junction diode device in FIG. 1A showing the embedded diode connected in series with the depletion mode NLDMOS device.

FIG. 1B shows an equivalent circuit for the lateral junction diode device 110 in FIG. 1A showing an embedded diode 120 in series with the depletion mode NLDMOS device 130. As noted above the n+ drain of the NLDMOS device 130 shares the same node as the HV cathode 141. The embedded diode 120 is shown as a 7V clamp diode because the embedded diode 120 can function to clamp the gate 133 to source 131 voltage ($V_{GS}$) for the NLDMOS device 130 (as it is electrically in parallel to it) to a below ground voltage, such as at −7V, sufficient to turn off the NLDMOS device 130 despite the NLDMOS device 130 being a depletion mode device.

More generally, the embedded diode 120 has a reverse breakdown voltage of 5 volts to 100 volts, such as 5 volts to 15 volts. The BV of the embedded diode 120 should not exceed the gate 133 to source 131 BV which is limited by the BV of the gate dielectric layer 134, typically being a gate oxide 15 nm to 100 nm thick which will typically safely sustain a voltage across it of about 5V to 30V. This voltage clamping provided is needed during the blocking mode for a bootstrap diode of a high side gate driver IC. As noted above the lateral junction diode device 110 functions as a two terminal device (anode 122 shown as 'A' and a HV cathode 141 shown as 'K'). There is a common node between the cathode 121 of the embedded diode 120 and the S 131 of the NLDMOS device 130, which is also common with the p+ contact 137 of the Dwell 139, which is the node shown marked as $V_{k,aux}$ in FIG. 1B.

Regarding operation of the lateral junction diode device 110, at its on-state, where the V at the anode 122 is >the V at the cathode 141, the embedded diode 120 will become forward biased at a forward voltage of about ≥0.7V. As a result, current from the anode 122 will thus flow through the normally on channel region 135 which is an n-channel for the NLDMOS 130 device that together with the drift region extends from the S 131 to the drain (which shares the node with the HV cathode 141) since it is depletion mode device. During the off-state of the lateral junction diode device 110, referred to as the reverse blocking mode, where the V at the anode 122 is <the V at the HV cathode 141 (thus reversed biased), before the voltage reaches the clamp voltage which results from a junction breakdown analogous to that of Zener diode (e.g., −7 volts), a very small amount of reverse current from the cathode 121 to anode 122 will flow.

However, once the clamp voltage is reached, since the NLDMOS device 130 is normally on, essentially all the voltage at the common node $V_{K,aux}$ will apply to the cathode 121 of the embedded diode 120 which will make this embedded diode 120 have a junction breakdown resulting in keeping $V_{GS}$ at about −7V which is sufficient to turn off the NLDMOS device 130. Thus, during operation of the lateral junction diode device 110 as a bootstrap diode for a high side gate driver IC (see FIG. 3 described below), where the voltage at the cathode 141 may be at a voltage of several hundred volts above the voltage at the anode 122 (which is coupled to the G 133 of the NLDMOS device 130), the embedded diode 120 functions as a voltage clamp at about −7 V because once $V_K$, aux reaches about −7V, the embedded diode 120 will breakdown turning off the NLDMOS device 130 thus providing the function of reverse blocking.

FIGS. 2A-2P are cross-sectional diagrams showing processing progression for an example method of forming an IC including a lateral junction diode device, according to an example aspect. The in-process lateral junction diode device 110 and NLDMOS device 130 are shown in FIGS. 2A-2P as half-devices corresponding to the dashed lines shown in FIG. 1A to allow the features shown to be larger as they are both symmetric device components. FIG. 2A shows the in-process IC formed on a substrate 105 after NBdrift region photolithography and then an n-type ion implant to form the NBdrift sub-regions 136a, 136b, . . . . The NBdrift implant species can be phosphorus, at a dose from $1\times10^{12}$ to $1\times10^{13}$ cm$^{-2}$, implanted at an energy of 30 to 300 keV. The photoresist is shown in FIG. 2A as 205a. The photoresist 205a after the NBdrift implant is then stripped.

Figure 2B:
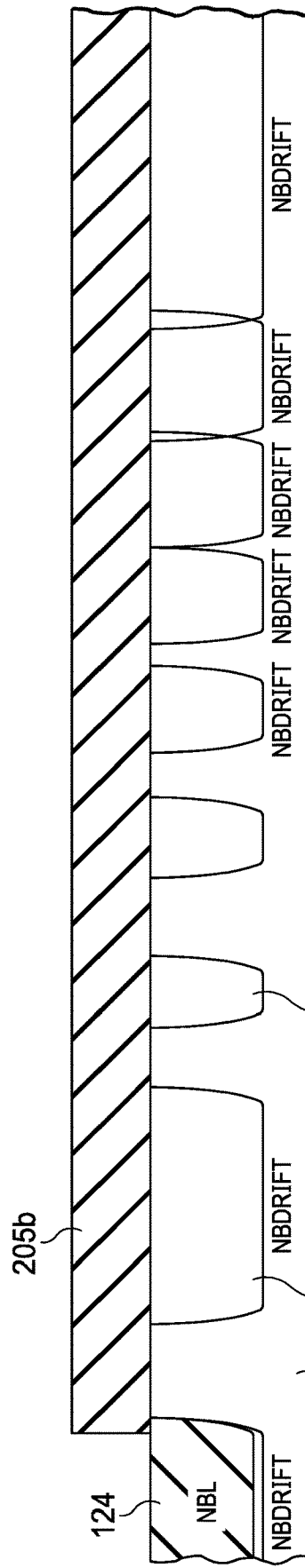

FIG. 2B shows the in-process IC after NBL photolithography to provide photoresist 205b and then an n+ ion implant to provide the dopant to form the NBL 124. The NBL species can be for example phosphorus, at a dose from $5\times10^{14}$ to $5\times10^{15}$ cm$^{-2}$, implanted at an energy of 50 to 300 keV. This is followed by stripping of the photoresist 205b and then a drive-in process with a typical drive time of 30 to 60 minutes at a temperature 1150° C. to 1250° C.

Figure 2C:
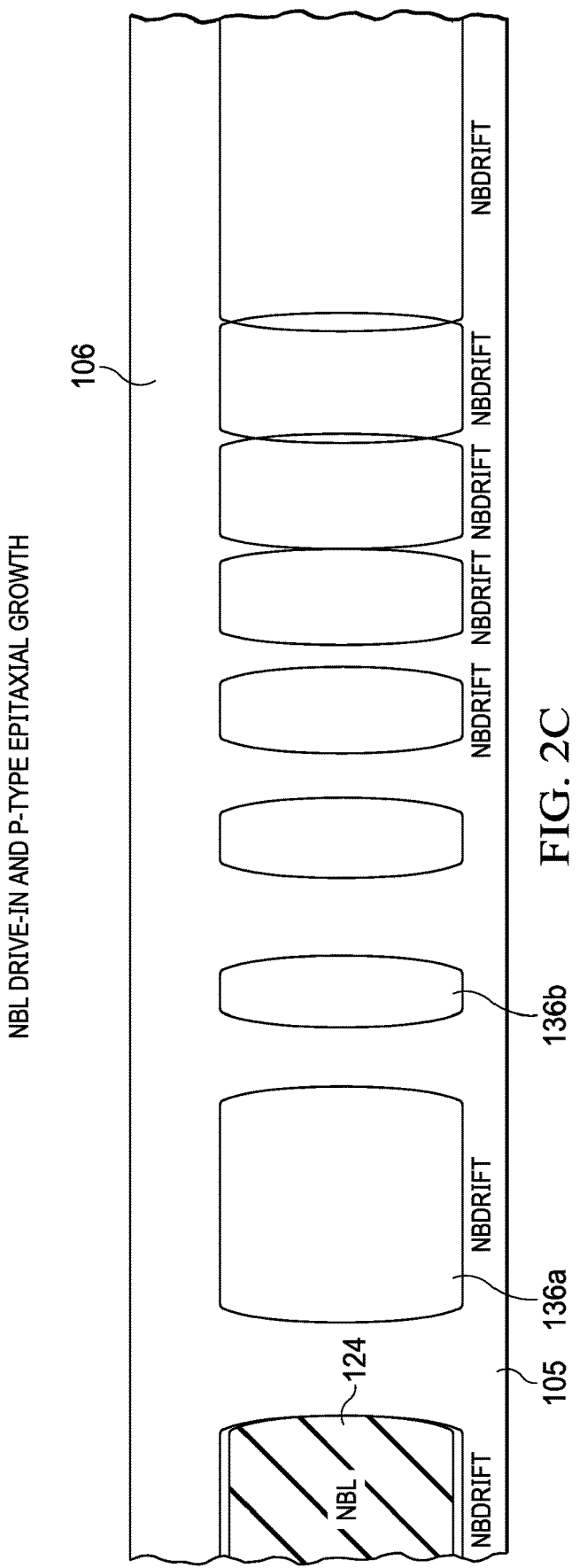
Figure 2D:
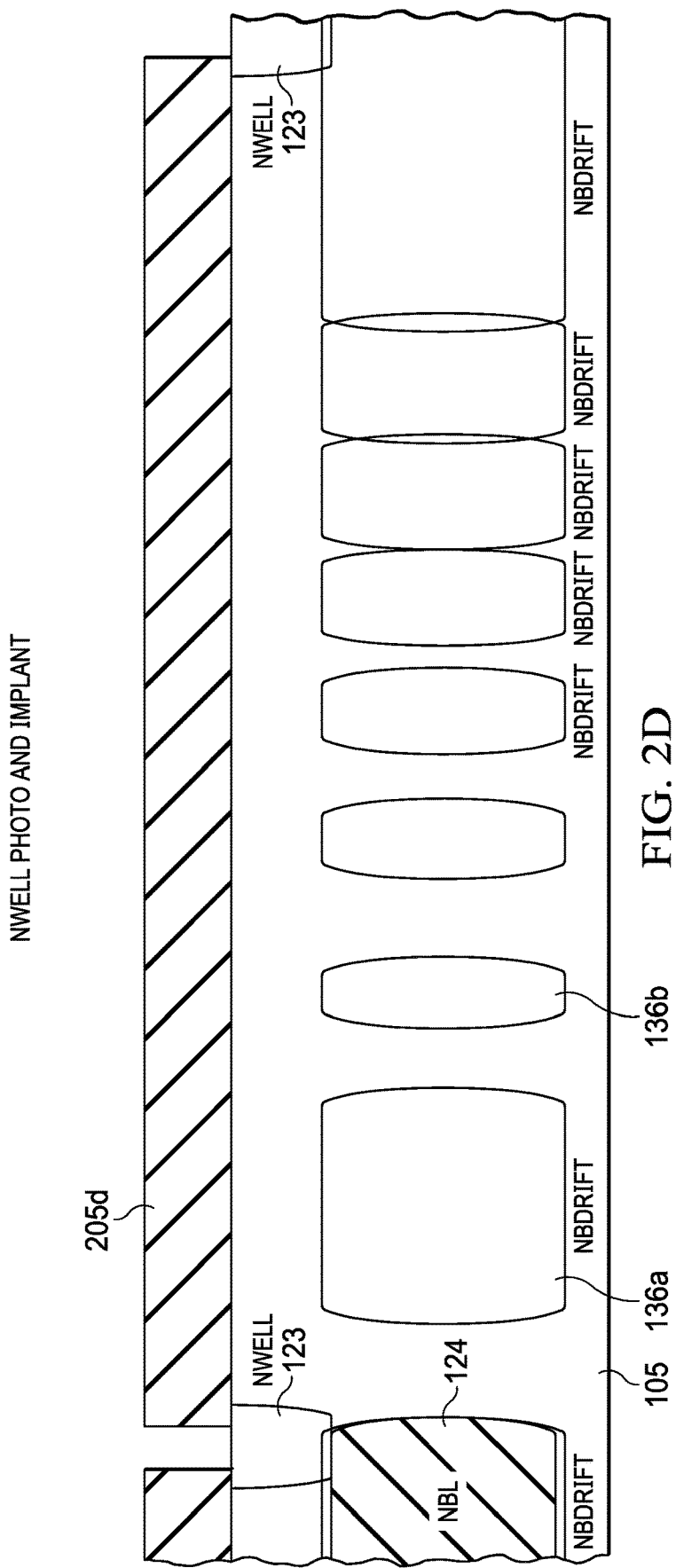

FIG. 2C shows the in-process IC after p-type epitaxial growth to form a p-epi layer 106 on the substrate 105. As noted above, the p-epi layer 106 is lightly doped having a typical boron doping concentration of about $1\times10^{15}$ cm$^{-3}$ (e.g., $7\times10^{14}$ cm$^{-3}$ to $1.4\times10^{16}$ cm$^{-3}$) or equivalently a resistivity of about 10 ohm·cm (e.g., 1 to 20 ohm·cm). FIG. 2D shows the in-process IC after nwell photolithography showing photoresist 205d and then an ion implant to form nwells 123, which is followed by the stripping of the photoresist 205d. The nwell implant species can be for example phosphorus, at a dose from $1\times10^{13}$ to $1\times10^{15}$ cm$^{-2}$, implanted at an energy of 100 to 500 keV.

Figure 2E:
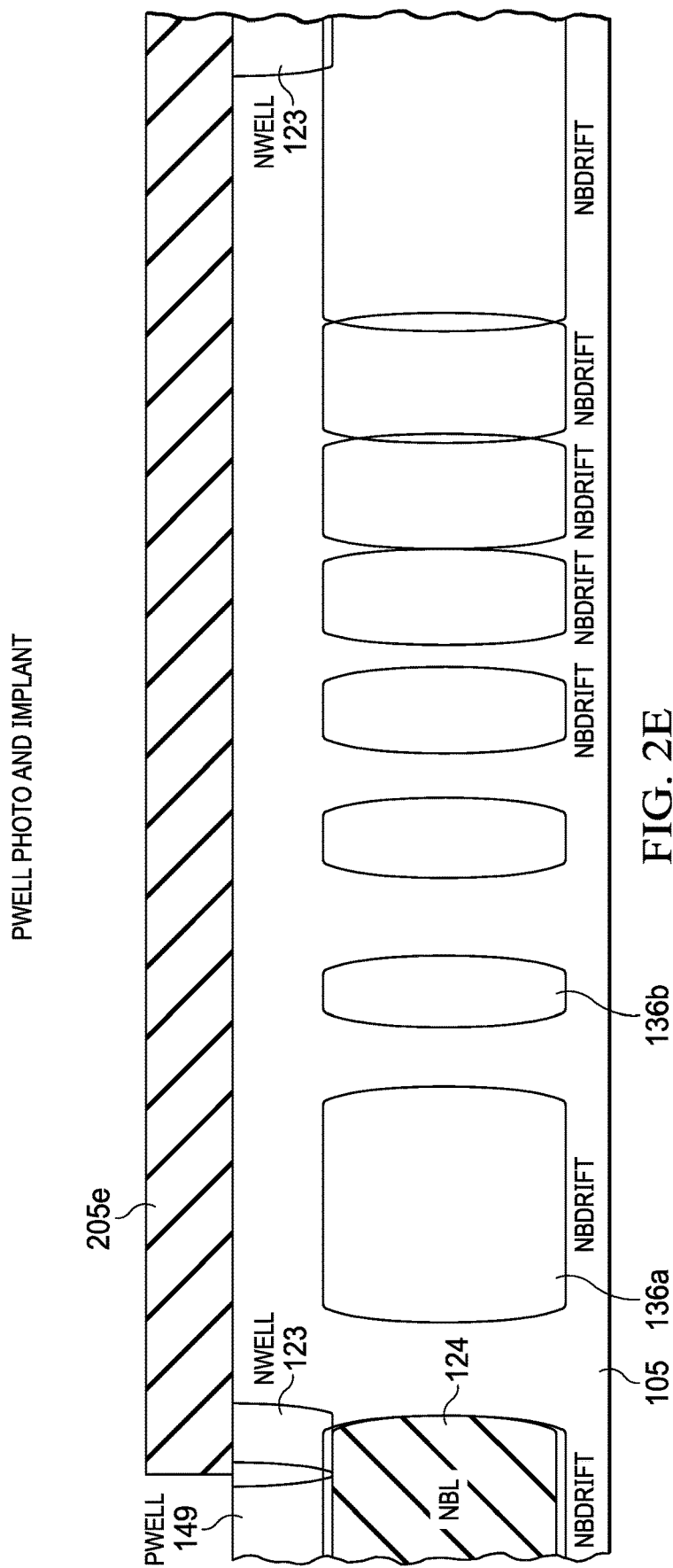
Figure 2F:
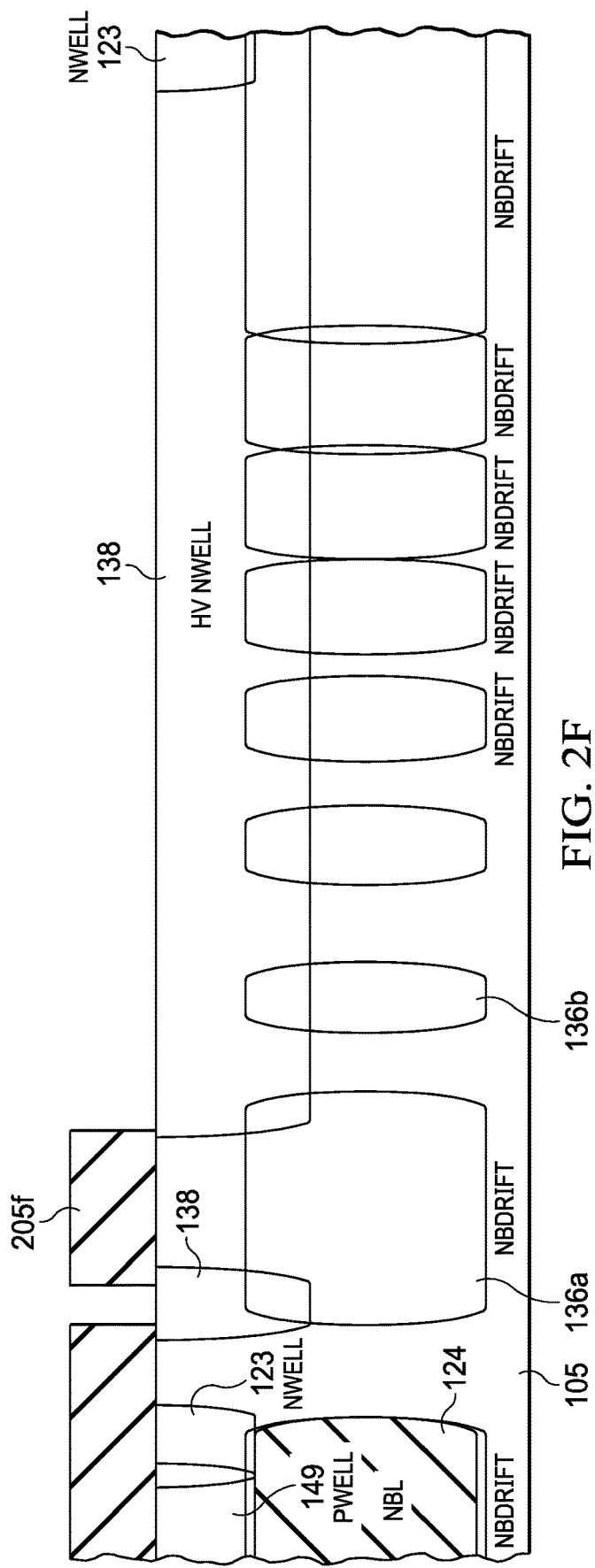

FIG. 2E shows the in-process IC after pwell photolithography to provide photoresist 205e and then a boron ion implant to form a first pwell 149, followed by the stripping of the photoresist 205e. The first pwell species can boron, at a dose from $1\times10^{13}$ to $1\times10^{15}$ cm$^{-2}$, implanted at an energy of 50 to 200 keV. FIG. 2F shows the in-process IC after high voltage nwell photolithography and an ion implant to form high voltage (HV) nwells 138, which is followed by stripping of the photoresist 205f, followed by a drive-in process. The HV nwell implant species can be for example phosphorus, at a dose from $1\times10^{12}$ to $1\times10^{14}$ cm$^{-2}$, implanted at an energy of 100 to 800 keV, with a drive performed at 1100° C. to 1250° C., for 100 to 500 minutes.

Figure 2G:
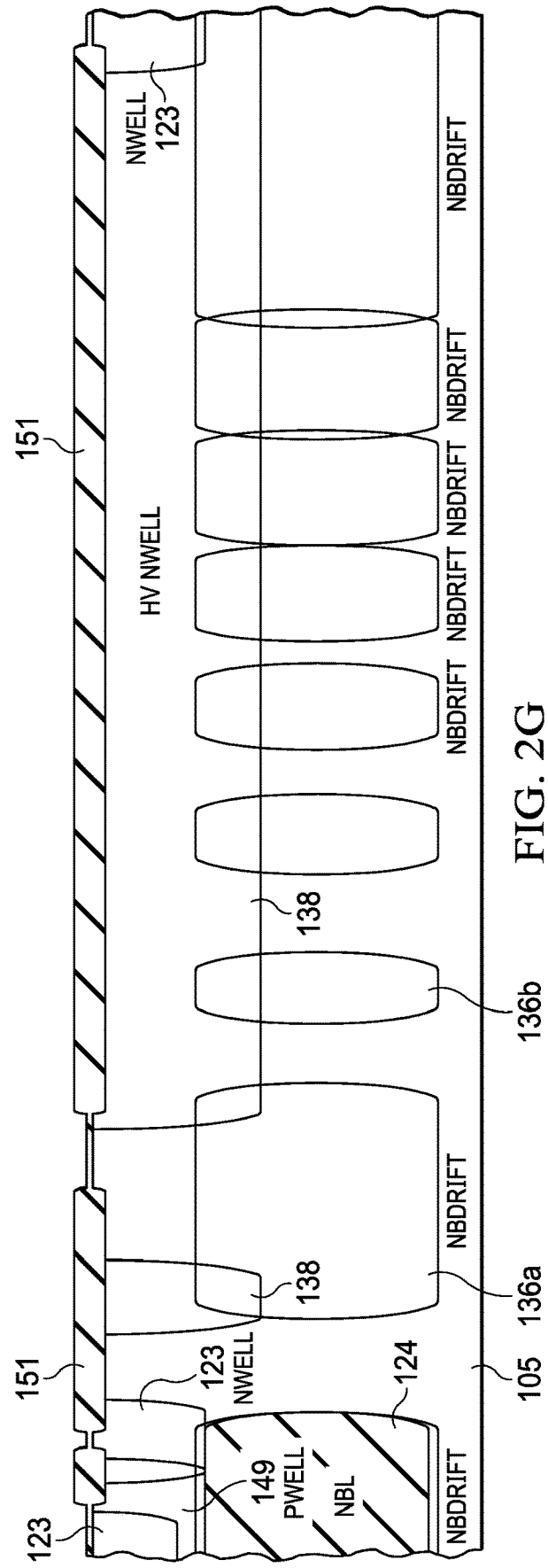
Figure 2H:
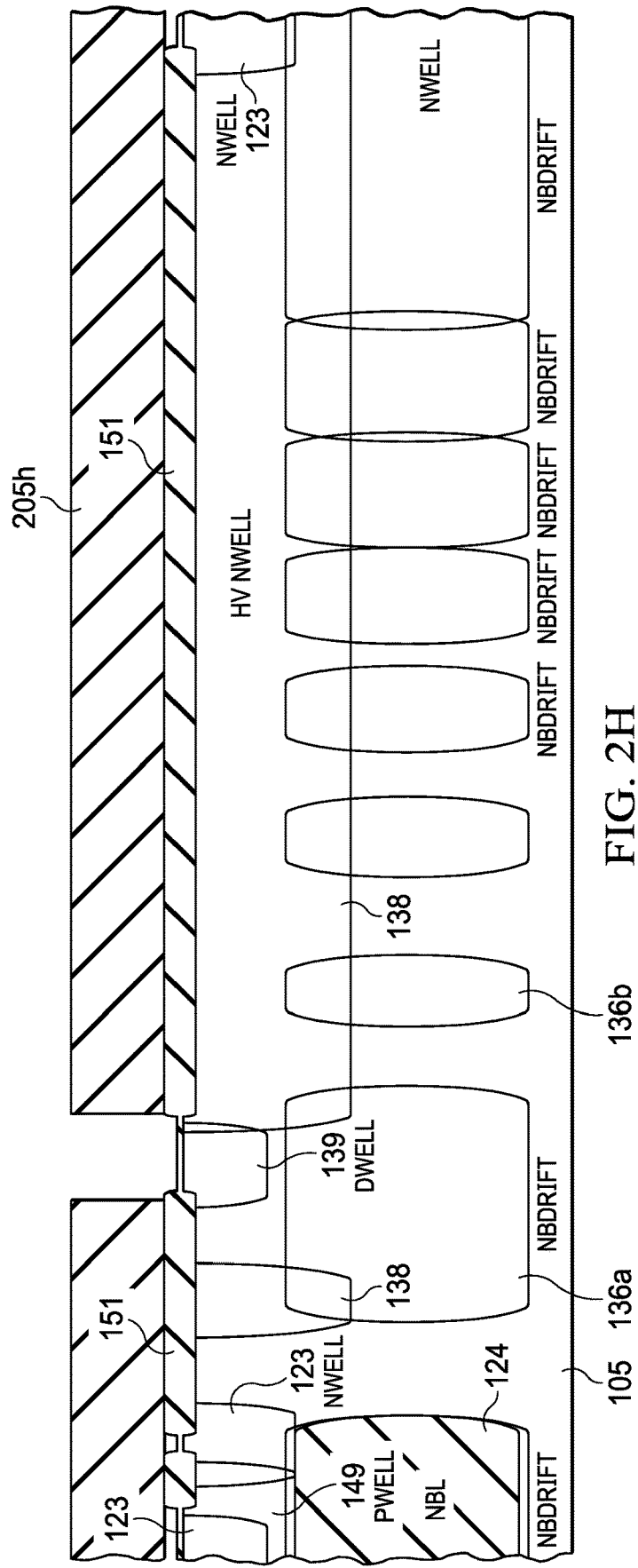

FIG. 2G shows the in-process IC after active area (shown as 'MOAT') photolithography, following the etch of a silicon nitride layer over a silicon oxide layer to open the areas to receive LOCal Oxidation Of Silicon (LOCOS), photoresist stripping, then local LOCOS to form field oxide 151. Alternatively, trench isolation may be utilized. FIG. 2H shows the in-process IC after a second pwell (sometimes called a deep pwell, or dwell) photolithography and dwell ion implant to form Dwells 139, then stripping of the photoresist 205h.

Figure 2I:
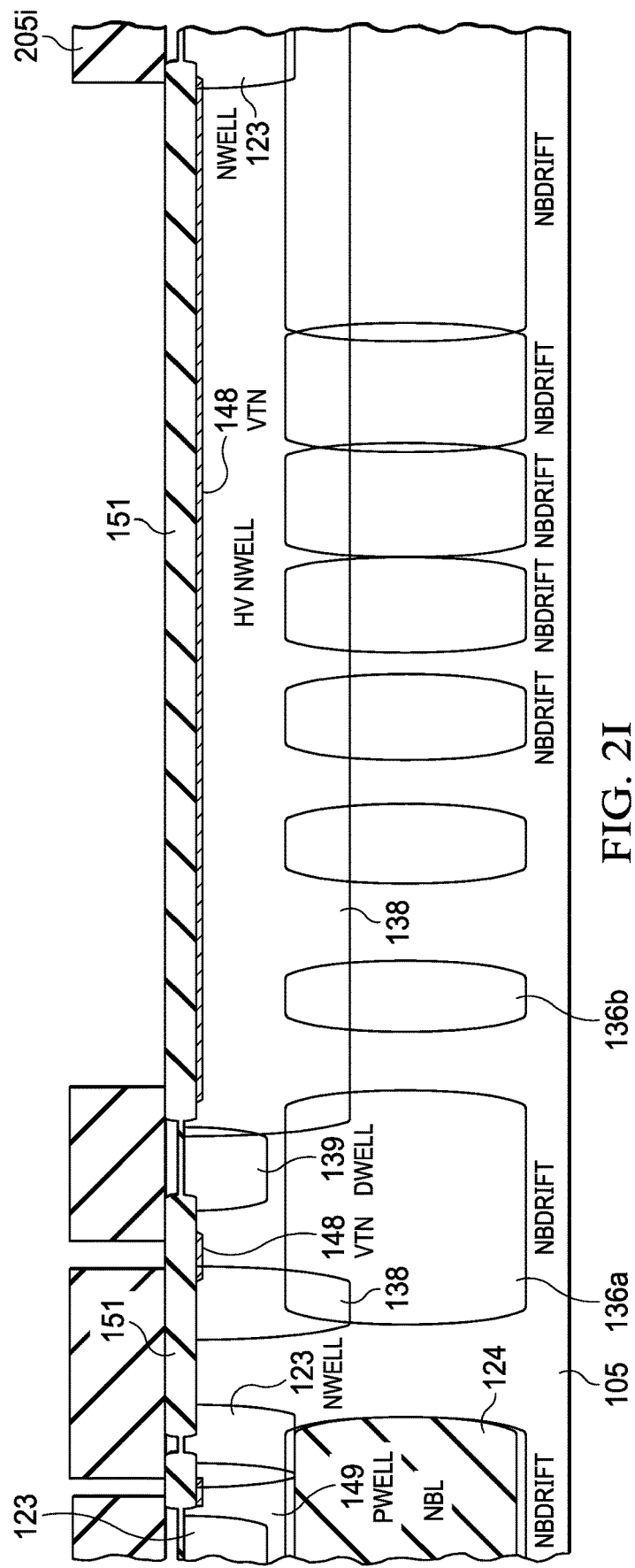
Figure 2J:
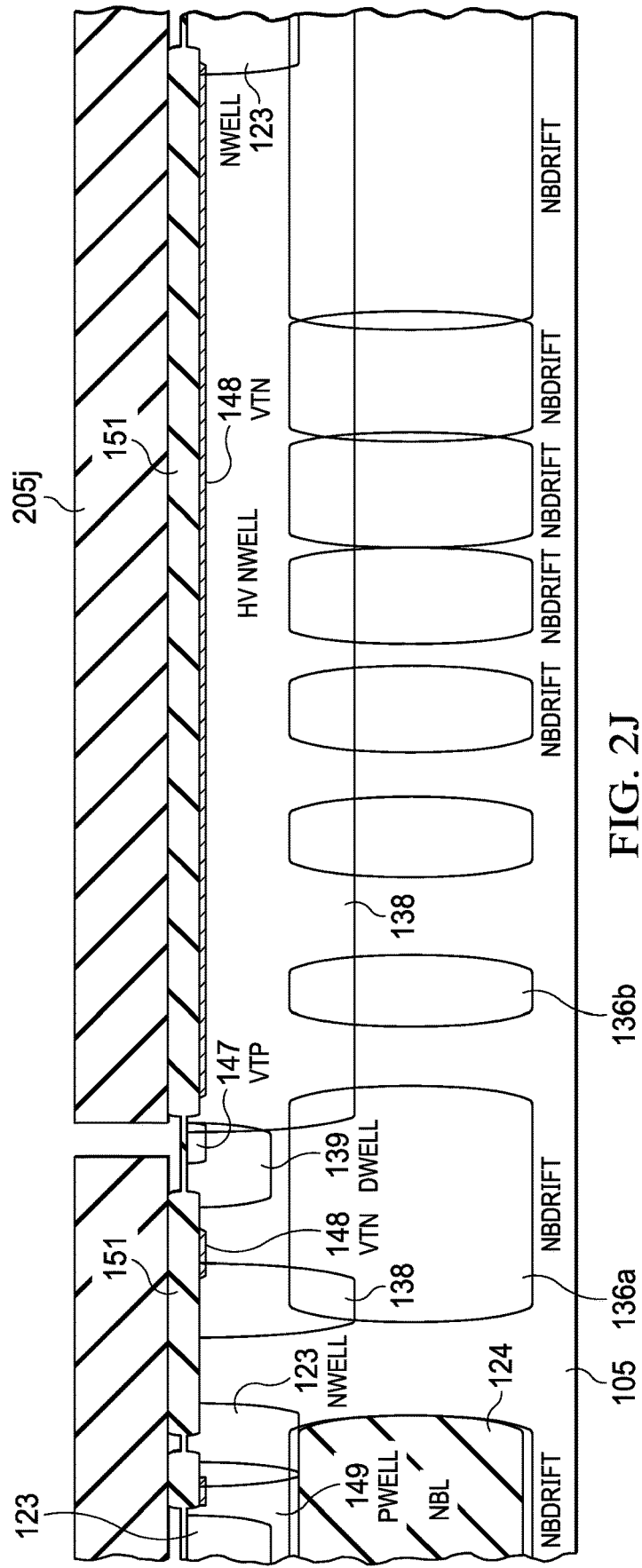
Figure 2K:
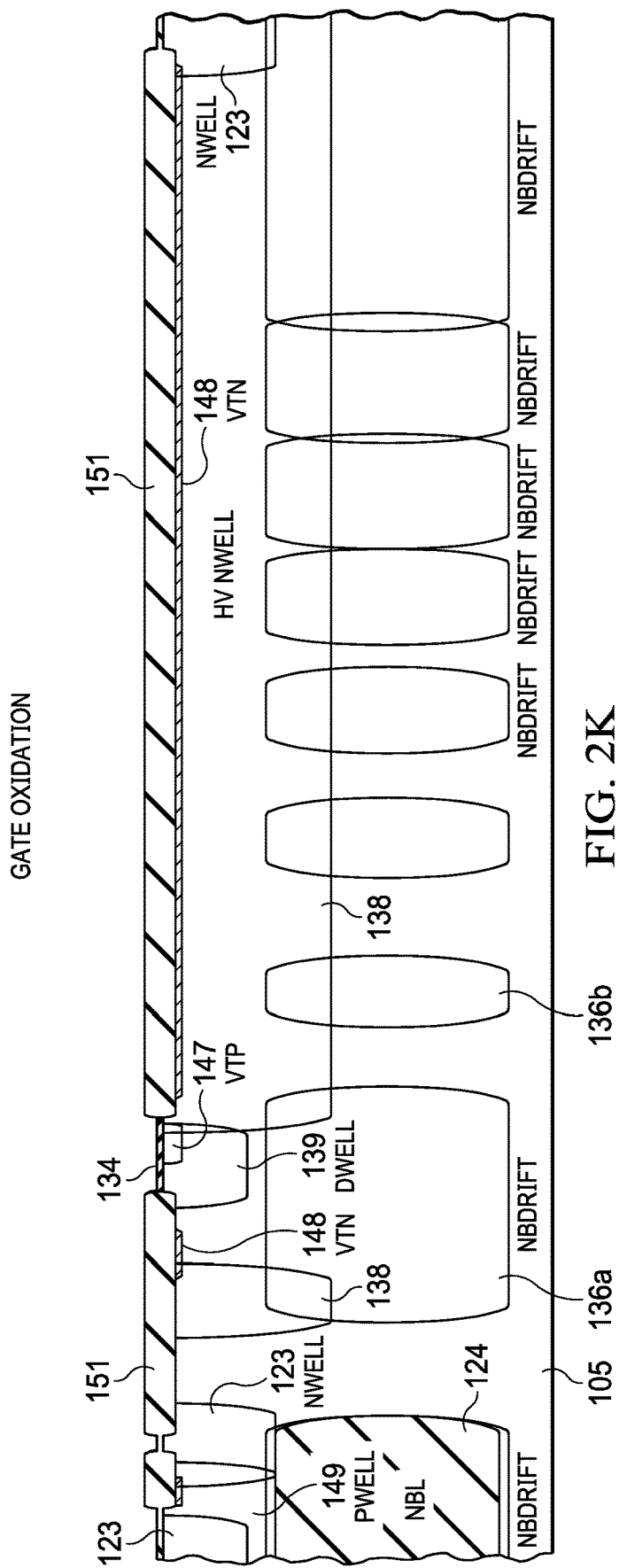

FIG. 2I shows the in-process IC after n-channel threshold adjust (VTN) photolithography and VTN ion implant to form VTN regions 148, then the stripping of the photoresist 205i. The adjust VTN species can be boron, for example at a dose from $1\times10^{12}$ to $1\times10^{13}$ cm$^{-2}$, implanted at an energy of 100 to 400 keV. FIG. 2J shows the in-process IC after VTP photolithography and ion implant to form VTP regions 147, then stripping of the photoresist 205j. The VTP implant species can be for example phosphorus, at a dose from $1\times10^{12}$ to $1\times10^{13}$ cm$^{-2}$, implanted at an energy of 10 to 300 keV. No diffusion is needed directly after this implantation. FIG. 2K shows the in-process IC after gate oxidation to provide a gate dielectric 134. As noted above, the gate dielectric layer 134 can comprise silicon oxide, silicon oxynitride, or other dielectric material.

Figure 2L:
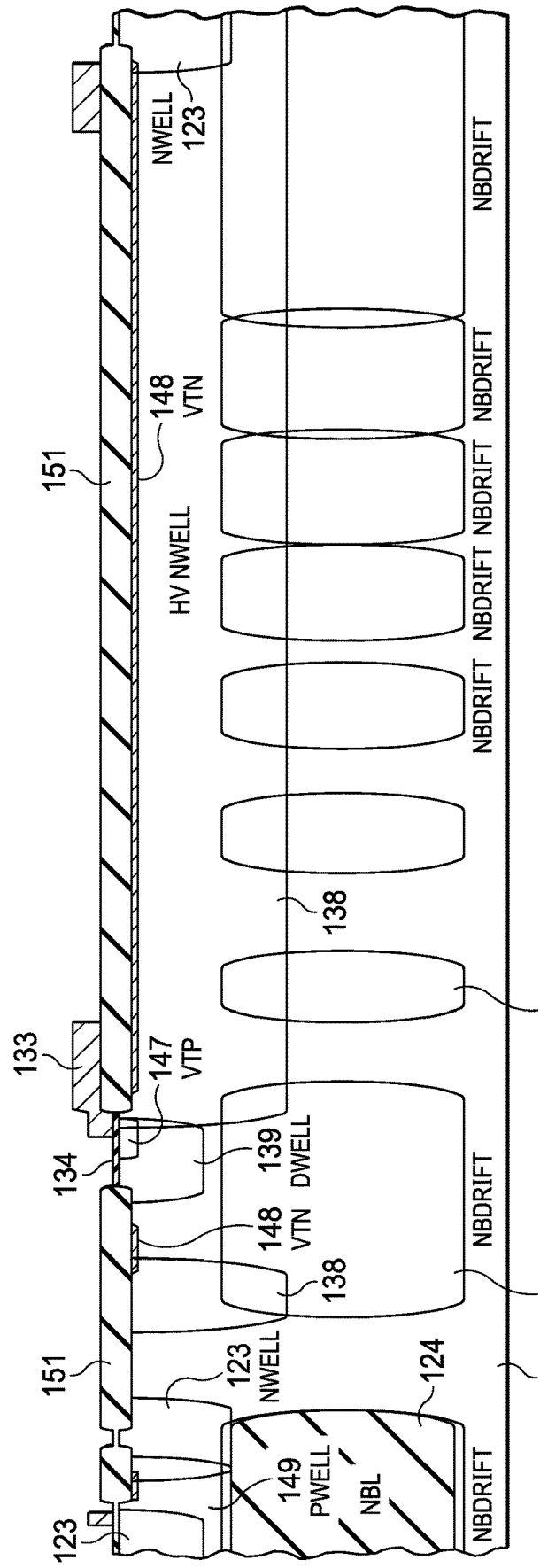

FIG. 2L shows the in-process IC after gate polysilicon deposition to form gate 133 and gate polysilicon photolithography and patterning, and the stripping of the photoresist strip. The gate 133 can comprise polysilicon be formed by a low pressure chemical vapor deposition (LPCVD) step. The gate 133 can comprise materials other than polysilicon.

Figure 2M:
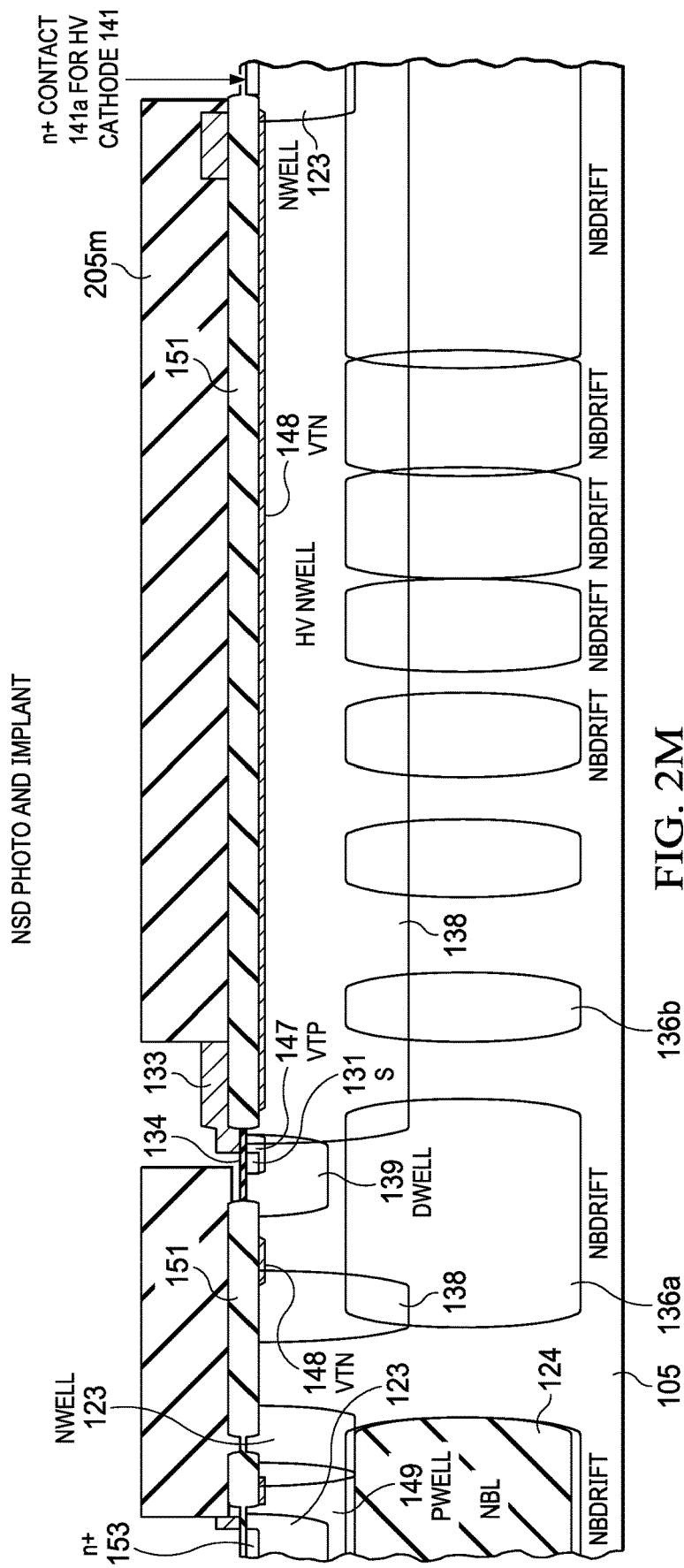

FIG. 2M shows the in-process IC after n+ source/drain (NSD) photolithography and NSD ion implantation to form n+ regions 153 including the S 131 and the n+ contact 141a for the HV cathode 141 that also provide n+ drain for the NLDMOS device. The NSD implant species can for example be arsenic, at a dose from $1\times10^{14}$ to $5\times10^{15}$ cm$^{-2}$, implanted at an energy of 20 to 200 keV, which is followed by stripping of the photoresist 205m.

Figure 2N:
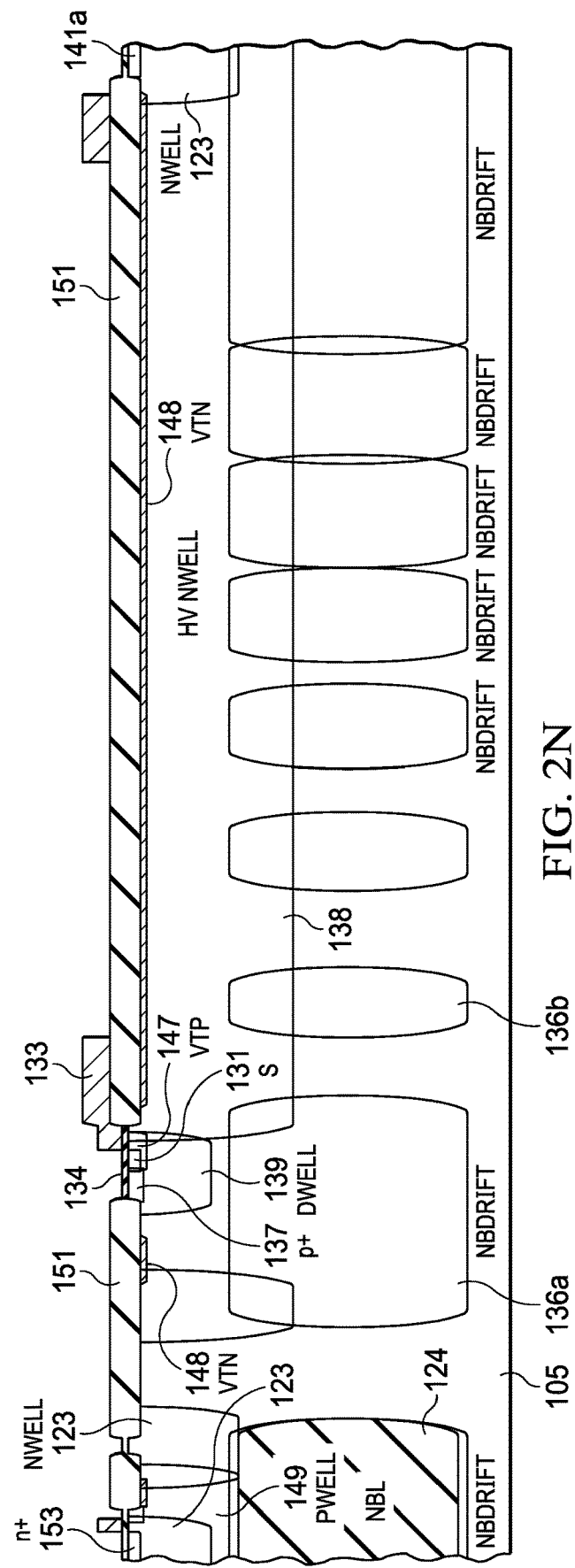
Figure 2O:
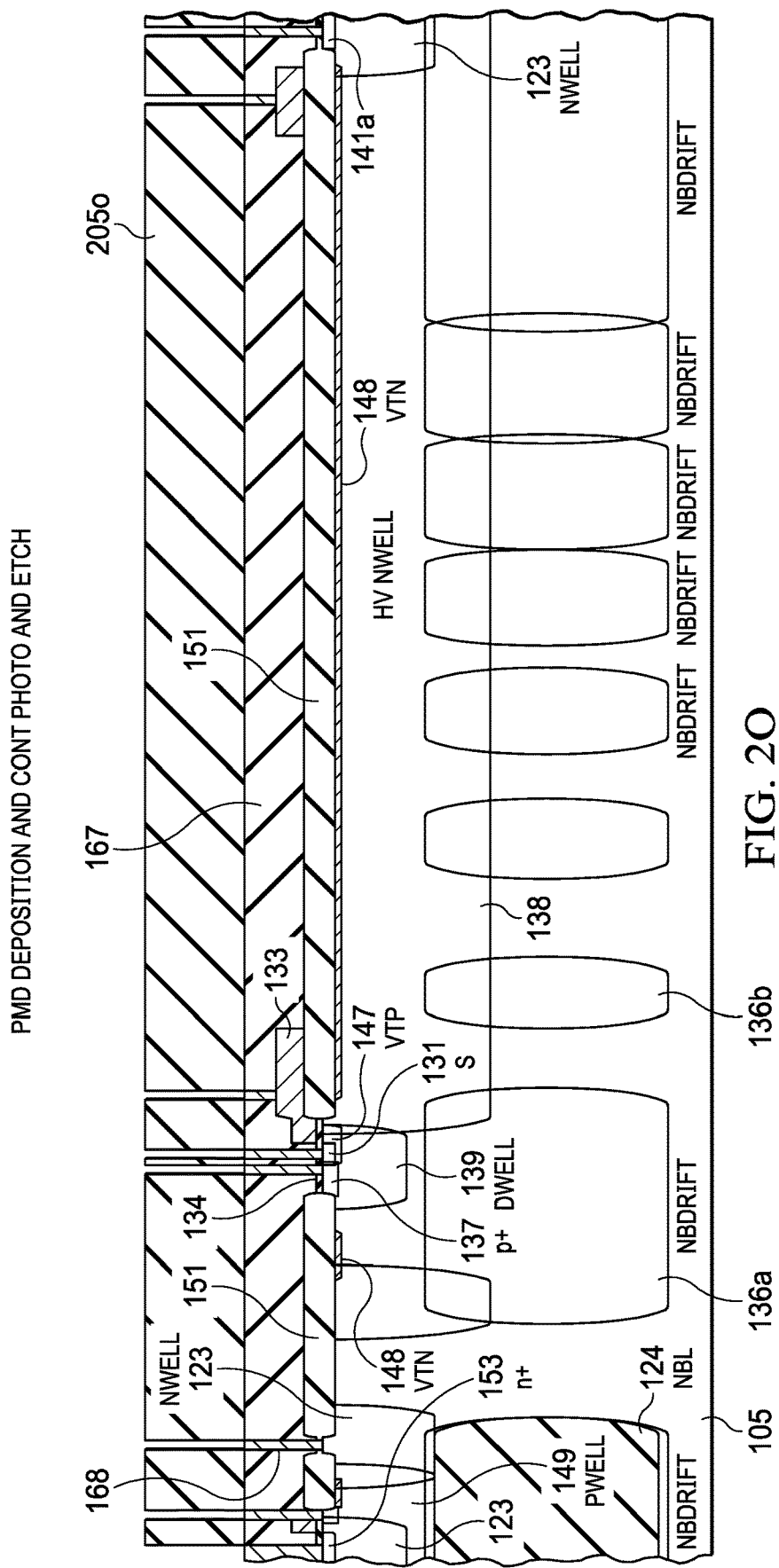
Figure 2P:
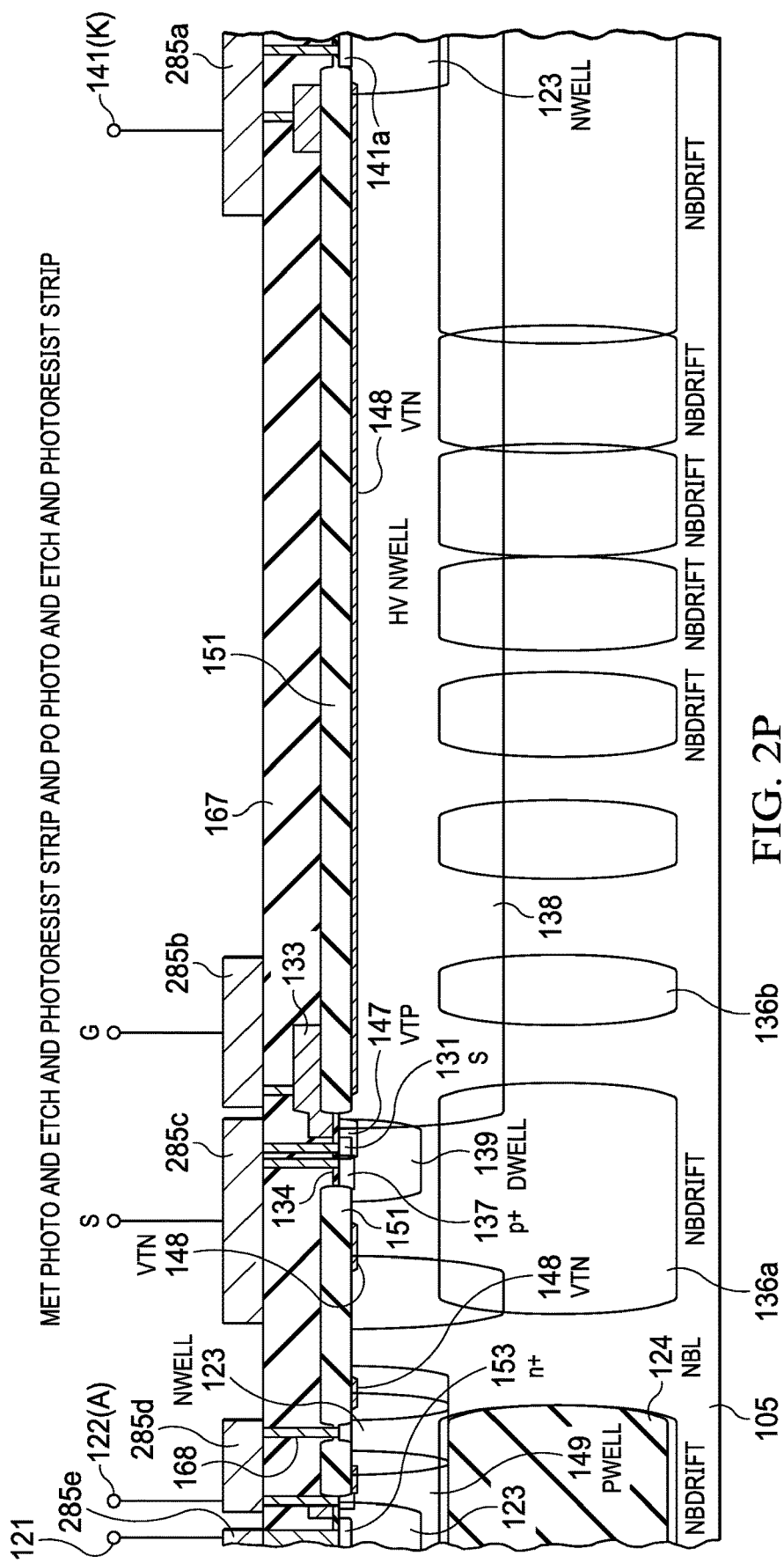

FIG. 2N shows the in-process IC after p+ source/drain (PSD) photolithography and PSD ion implant to form p+ regions including p+ contacts 137 and then stripping of the photoresist. The PSD implant species can for example be boron, at a dose from $1\times10^{14}$ to $5\times10^{15}$ cm$^{-2}$, implanted at an energy of 10 to 100 keV. FIG. 2O shows the in-process IC after pre-metal dielectric (PMD) deposition to form a dielectric layer 167 and contact (CONT) photolithography and etching to form contacts through the dielectric layer 167, followed by filling of the contacts to provide filled contacts 168, such as with W, and then by stripping of the photoresist 205o.

FIG. 2P shows the in-process IC after first metal deposition photolithography and etching to form first metal features including metal 285a as shown that provides metal contacting using filled contacts 168 to the n+ contact 141a to the HV cathode (K) 141 (which is the same node as the drain of the NLDMOS device 130) of the lateral junction diode device 110, metal 285b that provides metal contacting the gate 133 of the NLDMOS device 130, metal 285c that provides metal contacting the S 131. The metal also includes metal 285d contacting the anode 122 of both the lateral junction diode device 110 and the embedded diode 120, and metal 285e contacting the cathode 121 of the embedded diode 120. This is followed by stripping of the photoresist. Although not shown, as known in the art the method further includes one or more other metal levels separated by inter-level dielectric (ILD), including a second metal level that can provide the various connections between metal 1 features shown in FIG. 1A, such as gate 133 to anode 122, followed by passivation overcoat (PO) photolithography and PO etching, and then the stripping of the PO photoresist.

Figure 3:
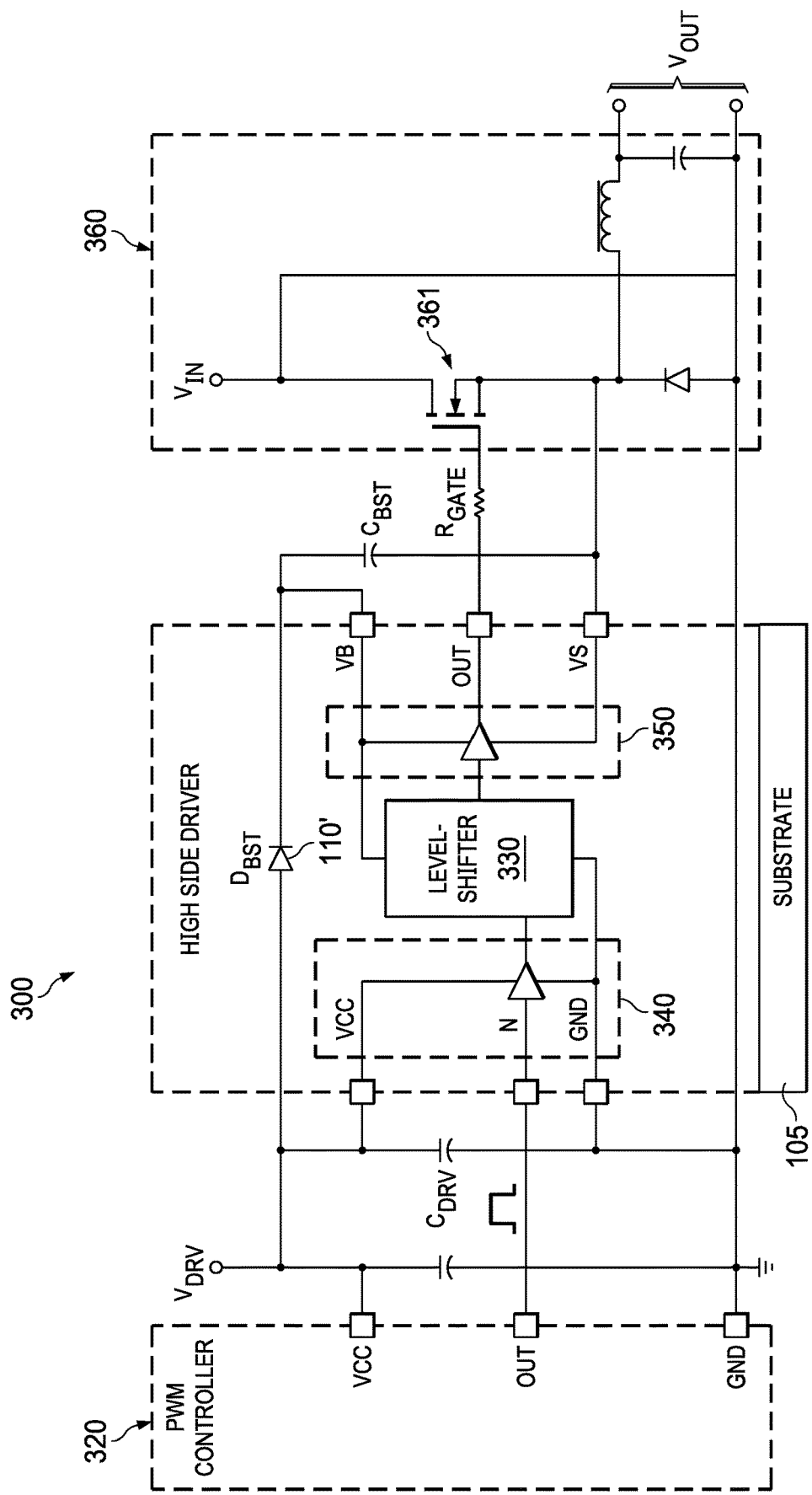
FIG. 3 depicts a high side gate driver IC including a disclosed lateral junction diode device as its bootstrap diode.

FIG. 3 depicts a high side gate driver IC 300 including a disclosed lateral junction diode device shown as its bootstrap diode 110' which in FIG. 3 is shown as $D_{BST}$. The high side gate driver IC 300 is formed on a substrate 105 having at least a semiconductor surface layer. The high side gate driver IC 300 includes a level-shifter 330, an input (IN) pin, a VCC power supply (VCC), a high side floating supply (VB) node, and an output node (OUT). A ground (GND) referred low voltage controller 340 is on an input side of the level-shifter 330 and a high voltage referred driver 350 is on an output side of the level-shifter 330.

The bootstrap diode 110' is connected between the VCC pin and the VB pin. The power stage being driven by the high side gate driver IC 300 is shown as 360 that includes a power switch 361. A controller shown as a PWM controller 320 is shown providing a PWM control signal at its OUT pin that is coupled to the high side gate driver IC 300. As described above, during operation of the lateral junction diode device 110 as a bootstrap diode for the high side gate driver IC 300, where the voltage at the cathode 141 may be at a voltage of several hundred volts above the voltage at the anode 122 (which is coupled to the G 133 of the NLDMOS device 130), the embedded diode 120 functions as a voltage clamp at about 7 V because once the VK, aux node reaches about −7V, the embedded diode 120 will breakdown turning off the NLDMOS device 130 to provide the function of reverse voltage blocking.

EXAMPLES

Disclosed lateral junction diode devices are further illustrated by the following specific Examples, which should not be construed as limiting the scope or content of this Disclosure in any way.

Figure 4A:
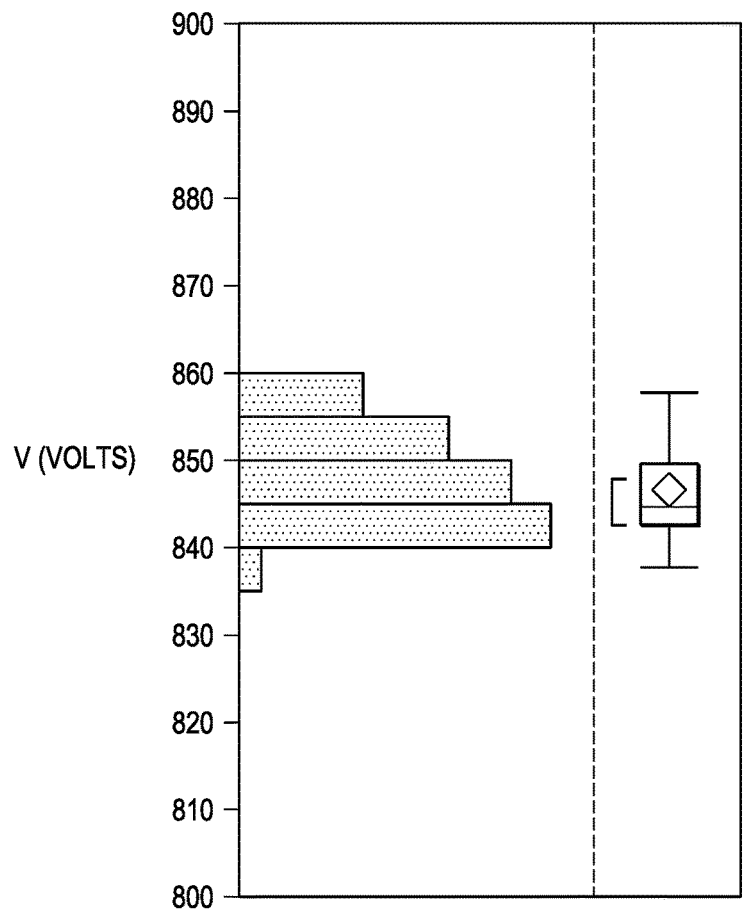
FIG. 4A, FIG. 4B, and FIG. 4D show measured current data for an example lateral junction diode device, where the lateral junction diode device evidences a high breakdown voltage (BV) in FIG. 4A and a significantly reduced substrate leakage current in FIGS. 4B and 4D as compared the body diode of a high voltage NLDMOS device shown in FIGS. 4C and 4E, respectively.
Figure 4B:
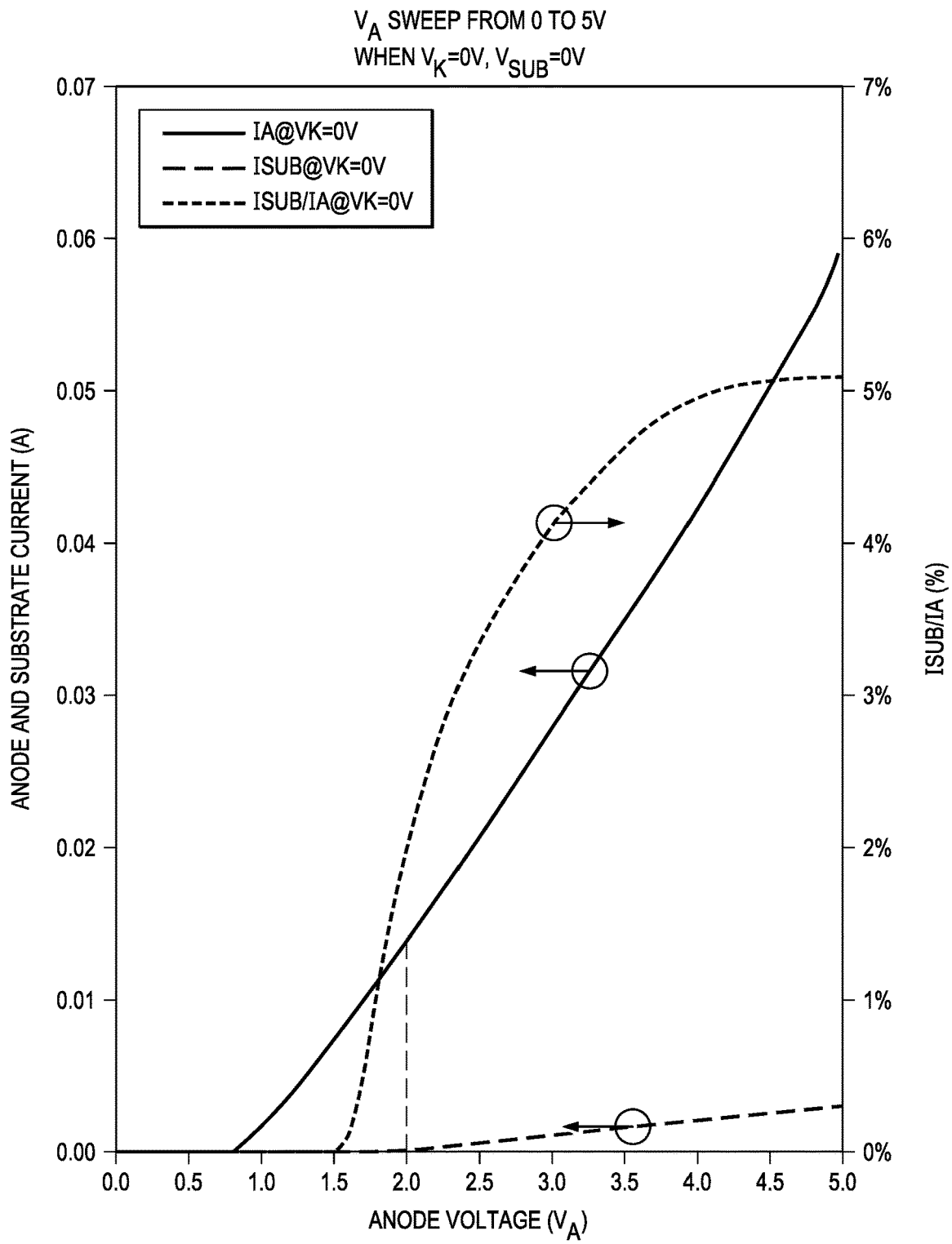
Figure 4C:
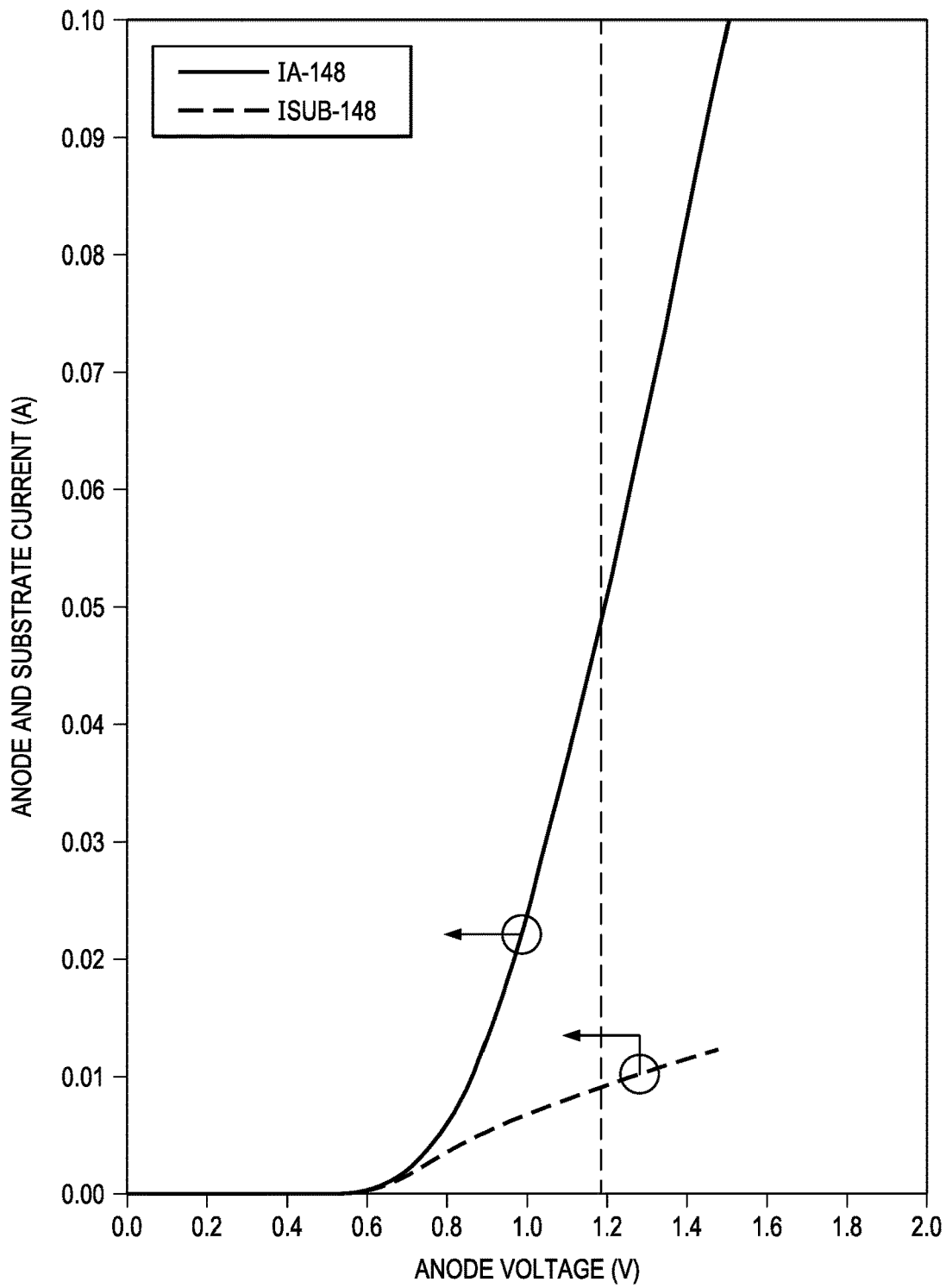
Figure 4D:
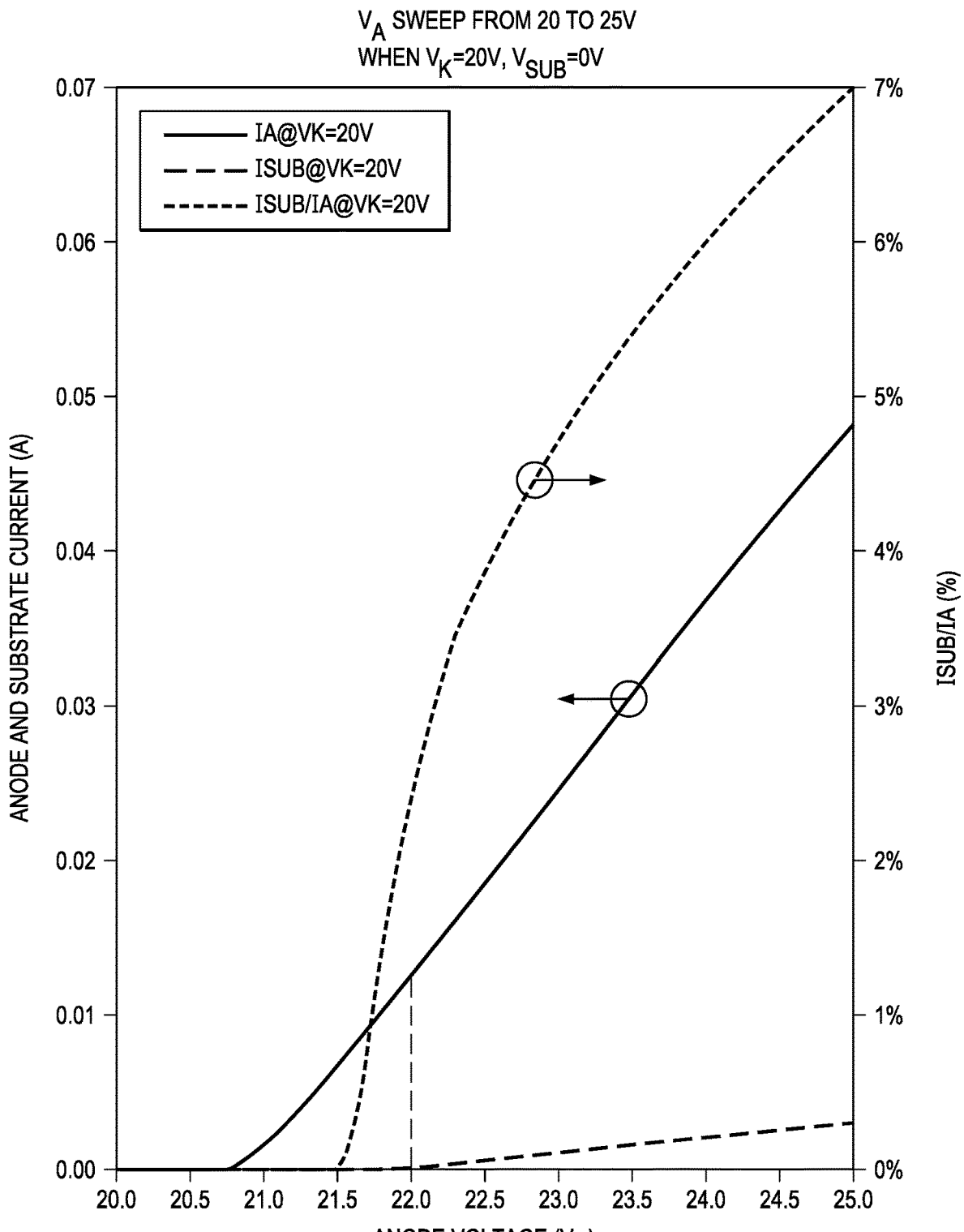

FIG. 4A, FIG. 4B, and FIG. 4D show example room-temperature measured current data from an example lateral junction diode device 110 formed using a process described above in FIGS. 2A-2P that evidences a high BV (FIG. 4A) and significantly reduced substrate leakage current (FIGS. 4B and 4D) as compared to the performance of a body diode of a high voltage LDMOS device alone. FIG. 4A shows the reverse breakdown voltage distribution for the lateral junction diode device 110 showing a median value of 845 V. The BV value range for the conventional high voltage LDMOS device alone should be in a similar range of about 837 V.

Figure 4E:
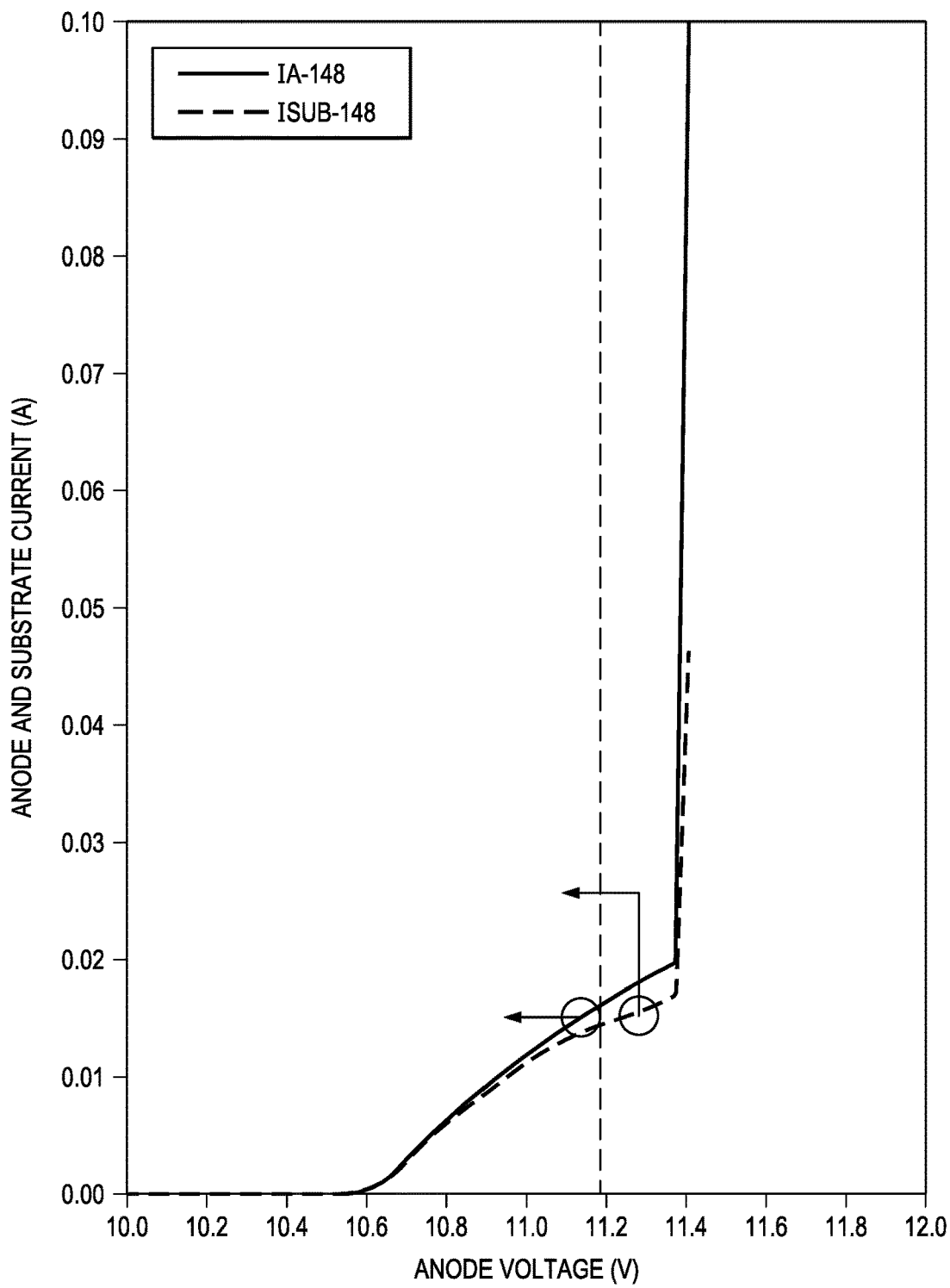

The dashed line shown in FIGS. 4B and 4D represents the substrate current (Isub) to anode current (Ia) ratio (Isub/$I_A$) that evidences how Isub is reduced by a disclosed lateral junction diode device. FIG. 4B shows of an $I_{SUB}/I_A$ of 1.9% measured with an anode 122 voltage $V_A$ swept from 0 to 5V, $V_K$ (the $V_K$ node is shown in FIG. 1B as $V_{K, aux}$ as described above)=0V, and a substrate voltage $V_{SUB}$=0. The $I_{SUB}/I_A$ is reduced when compared to the $I_{SUB}/I_A$ of 18% (almost 10 times more Isub) measured from the body diode of the high voltage LDMOS device as shown in FIG. 4C. FIG. 4D shows an Isub/IA of 2.3% measured with $V_A$ swept from 20V to 25V, $V_K$=20V and $V_{SUB}$=0 which is again a reduced Isub/IA as compared to the Isub/$I_A$ of 88% (over 40 times less % Isub) measured from the body diode of a high voltage LDMOS device as shown in FIG. 4E.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects and variations of disclosed aspects are possible within the scope of the claimed invention, and further additions, deletions, substitutions and modifications may be made to the described aspects without departing from the scope of this Disclosure.

The invention claimed is:

1. A method of fabricating an integrated circuit (IC), comprising:
    forming in a semiconductor surface layer, doped a first conductivity type, a depletion-mode laterally diffused MOSFET (LDMOS device), including forming a source and a drain doped a second conductivity type within said substrate, a channel region between the source and the drain, a gate dielectric over the channel region, a gate over the gate dielectric, and a drift region between said channel region and said drain, wherein said drain also provides a first cathode for a lateral junction diode having a first anode adjacent the source and running in parallel with a path between said source and said drain;
    forming a clamp diode including a second cathode and a second anode, wherein said clamp diode is junction-isolated from the LDMOS device by a doped region of the second conductivity type located between said second anode and said source, and
    directly connecting said gate to said second anode, and directly connecting said source to said second cathode.

2. The method of claim 1, wherein said semiconductor surface layer comprises a p-type epitaxial layer having a doping concentration less than $1.0 \times 10^{16}$ cm$^{-3}$, and wherein said LDMOS device comprises an NLDMOS device.

3. The method of claim 1, further comprising forming a first metal interconnection to connect said gate to said second anode and to said isolation region, and forming a second metal interconnection to connect said source to said second cathode.

4. The method of claim 1, wherein said drift region includes a diluted drift region with lower doping towards said source as compared to a doping level towards said drain.

5. The method of claim 1, wherein said clamp diode has a reverse breakdown voltage in a range between about 5 volts and about 15 volts.

6. The method of claim 1, wherein said lateral junction diode device provides at least a 200 V reverse breakdown voltage.

7. The method of claim 1, wherein said gate comprises a polysilicon gate electrode that is formed by a low pressure chemical vapor deposition (LPCVD) process.

8. A method of fabricating an integrated circuit (IC), comprising:

forming a laterally diffused MOSFET (LDMOS) device, including:

forming an n-type source region in a p-type semiconductor substrate;

forming an n-type drain region in the semiconductor substrate; and forming a gate electrode over the semiconductor substrate between the source region and the drain region;

forming an isolation region laterally spaced apart from the source region, the isolation region bounded by an n-type buried layer and an n-type well region that reaches from a surface of the substrate to the buried layer;

forming a p-type doped region and an n-type doped region within the isolation region, the p-type doped region and the n-type doped region forming a diode;

connecting the n-type doped region to the source region via a first conductive path; and connecting the p-type doped region to the gate electrode via a second conductive path.

9. The method of claim 8, wherein the diode has a reverse breakdown voltage in a range between about 5 volts and about 15 volts.

10. The method of claim 8, wherein the p-type doped region is a first p-type doped region and the diode is a first diode, and further comprising forming a second p-type doped region adjacent the source region, the second p-type doped region forming a second diode with the drain region, the second diode having an anode connected to the source region and a cathode connected to the drain region.

11. The method of claim 10, wherein the n-type doped region of the first diode is connected to the p-type doped region of the second diode.

12. The method of claim 10, wherein the second diode provides at least a 200 V reverse breakdown voltage.

13. The method of claim 8, wherein the drift region is formed as a diluted drift region with lower doping towards the source region as compared to a doping level towards the drain region.

* * * * *